United States Patent
Shibasaki et al.

(10) Patent No.: US 12,351,686 B2
(45) Date of Patent: Jul. 8, 2025

(54) CURABLE RESIN COMPOSITION, DRY FILM AND CURED PRODUCT OF SAME, AND ELECTRONIC COMPONENT CONTAINING SAID CURED PRODUCT

(71) Applicant: TAIYO HOLDINGS CO., LTD., Saitama (JP)

(72) Inventors: Yoko Shibasaki, Hiki-gun (JP); Chihiro Funakoshi, Hiki-gun (JP)

(73) Assignee: TAIYO HOLDINGS CO., LTD., Hiki-gun (JP)

( * ) Notice: Subject to any disclaimer, the term of this patent is extended or adjusted under 35 U.S.C. 154(b) by 633 days.

(21) Appl. No.: 17/640,180

(22) PCT Filed: Sep. 2, 2020

(86) PCT No.: PCT/JP2020/033228
§ 371 (c)(1),
(2) Date: Mar. 3, 2022

(87) PCT Pub. No.: WO2021/045085
PCT Pub. Date: Mar. 11, 2021

(65) Prior Publication Data
US 2022/0325047 A1    Oct. 13, 2022

(30) Foreign Application Priority Data

Sep. 6, 2019   (JP) .................. 2019-162834

(51) Int. Cl.
| | | |
|---|---|---|
| C08G 73/14 | (2006.01) | |
| C08G 18/34 | (2006.01) | |
| C08G 18/79 | (2006.01) | |
| C08G 59/20 | (2006.01) | |
| C08K 3/30 | (2006.01) | |
| C08K 3/36 | (2006.01) | |
| C08L 63/00 | (2006.01) | |
| C08L 79/08 | (2006.01) | |

(52) U.S. Cl.
CPC ............... *C08G 73/14* (2013.01); *C08K 3/30* (2013.01); *C08K 3/36* (2013.01); *C08L 79/08* (2013.01); *C08G 18/34* (2013.01); *C08G 18/79* (2013.01); *C08G 59/20* (2013.01); *C08K 2003/3045* (2013.01); *C08L 63/00* (2013.01)

(58) Field of Classification Search
CPC ........ C08G 73/14; C08G 18/34; C08G 18/79; C08G 59/20; C08L 79/08; C08L 63/00
See application file for complete search history.

(56) References Cited

U.S. PATENT DOCUMENTS

| | | |
|---|---|---|
| 6,887,967 B2 | 5/2005 | Ichinose et al. |
| 10,202,493 B2 | 2/2019 | Murakami et al. |
| 2016/0152773 A1 | 6/2016 | Murakami et al. |
| 2016/0160045 A1* | 6/2016 | Furuta ............... C08G 73/1053 428/413 |

FOREIGN PATENT DOCUMENTS

| | | | |
|---|---|---|---|
| CN | 1435448 A | 8/2003 | |
| CN | 105408394 A | 3/2016 | |
| CN | 106662813 A | 5/2017 | |
| CN | 109312045 A | 2/2019 | |
| JP | 2001-226464 A | 8/2001 | |
| JP | 2004-250584 A | 9/2004 | |
| JP | WO 2010/107045 A1 | 9/2010 | |
| JP | 2015-155500 A | 8/2015 | |
| JP | 2017-226737 A1 | 12/2017 | |
| JP | 2018-189851 A | 11/2018 | |
| WO | WO 2010/107045 A1 | 9/2010 | |
| WO | WO 2015/008744 A1 | 1/2015 | |
| WO | WO 2015/190210 A1 | 12/2015 | |
| WO | WO 2017/221922 A1 | 12/2017 | |
| WO | WO-2017209176 A1 * | 12/2017 | ............. G03F 7/037 |

OTHER PUBLICATIONS

Machine translation of WO-2017221922-A1 obtained from WIPO Patentscope (Year: 2017).*
Machine translation of WO-2017209176-A1 obtained from WIPO Patentscope (Year: 2017).*
Machine translation of WO2015190210A1 obtained from IP.com (Year: 2015).*
Combined Chinese Office Action and Search Report issued Dec. 27, 2023 in Chinese Patent Application No. 202080058929.3, 10 pages.
International Search Report issued Oct. 27, 2020 in PCT/JP2020/033228 filed Sep. 2, 2020, 2 pages.

* cited by examiner

*Primary Examiner* — Kregg T Brooks
*Assistant Examiner* — David R. Foss
(74) *Attorney, Agent, or Firm* — Oblon, McClelland, Maier & Neustadt, L.L.P.

(57) ABSTRACT

Provided is a curable resin composition that has excellent heat resistance and low warpage and is, furthermore, capable of improving light transmittance in cured products, a dry film and its cured product of, and an electronic component containing the cured product. A curable resin composition containing (A) an amide-imide resin, (B) a thermosetting resin, (C) a thermosetting accelerator and (D) inorganic particles, wherein the amide-imide resin (A) is a reaction product of an isocyanurate-type polyisocyanate synthesized from an isocyanate having an aliphatic structure and a tricarboxylic anhydride having an aliphatic structure and has a number-average molecular weight of 500 to 1000; a dry film and its cured product; and an electronic component containing the cured product were obtained.

20 Claims, No Drawings

CURABLE RESIN COMPOSITION, DRY FILM AND CURED PRODUCT OF SAME, AND ELECTRONIC COMPONENT CONTAINING SAID CURED PRODUCT

CROSS-REFERENCE TO RELATED APPLICATIONS

This application is a national stage application of International Application No. PCT/JP2020/033228, filed Sep. 2, 2020, which is based upon and claims the benefit of priority to Japanese Patent Application No. 2019-162834, filed Sep. 6, 2019. The entire contents of these applications are incorporated herein by reference.

TECHNICAL FIELD

The present invention relates to a curable resin composition, for example, a curable resin composition for an interlayer insulating material that is used in rewiring or the like of a printed wiring board, a dry film and a cured product of the same, and an electronic component including the cured product.

BACKGROUND ART

Hithertofor, curable compositions such as those containing an epoxy resin and a phenol resin as thermosetting components have been used as an interlayer insulating material for printed wiring boards, for improving characteristics of the cured products, such as heat resistance thereof (for example, Patent Document 1).

PRIOR ART DOCUMENT

Patent Document

Patent Document 1: JP-A-2001-226464

SUMMARY OF INVENTION

Problem to be Solved by the Invention

However, the use of phenol resin as in Patent Document 1 was found to have the curable resin compositions, dry films and its cured products colored in faint yellow, faint reddish brown or the like. This is considered to be derived from the faint yellow color or light reddish brown color that phenol resin originally has. Even when a polyimide resin is used, wherein the polyimide resin has an aromatic ring in the polyimide skeleton, the resultant curable resin compositions, dry films and cured products can be colored in light yellow, light reddish brown or the like, similarly to the case where the phenol is used Therefore, an object of the present invention is to provide a curable resin composition having excellent heat resistance and low warpage, and furthermore, capable of improving light transmittance in the cured product, a dry film containing the same, a cured product of the dry film, and a printed wiring board containing the cured product.

Means for Solving the Problem

As a result of intensive studies in consideration of the above-described object, the present inventors found a curable resin composition comprising:

(A) an amide-imide resin,
(B) a thermosetting resin,
(C) a thermosetting accelerator, and
(D) inorganic particles, wherein the amide-imide resin (A) is a reaction product of an isocyanurate-type polyisocyanate synthesized from an isocyanate having an aliphatic structure and a tricarboxylic anhydride having an aliphatic structure and has a number-average molecular weight of 500 to 1000 thereby completing the present invention.

In the curable resin composition of the present invention, the thermosetting resin (B) is preferably selected from a group consisting of an epoxy compound having a biphenyl skeleton, an epoxy compound having a dicyclopentadienyl skeleton and a mixture of these.

The curable resin composition of the present invention is preferably configured to be cured to give a cured coated film, and the light transmittance at 450 nm of the cured coated film when having a film thickness of 20 μm is 95% or greater.

Furthermore, the curable resin composition of the present invention is preferably configured to be cured to give a cured coated film, and the residual stress of the cured coated film is less than 25 MPa.

In addition, other object of the present invention are achieved by a dry film comprising a resin layer prepared from the curable resin composition, a cured product thereof and an electronic component comprising the cured product, respectively.

Effects of Invention

When the curable resin composition of the present invention is used, a cured product thereof has excellent heat resistance and low warpage, and furthermore, it is excellent in light transmittance in the cured product.

MODE FOR CARRYING OUT THE INVENTION

A curable resin composition of the present invention contains (A) an amide-imide resin, (B) a thermosetting resin, (C) a thermosetting accelerator and (D) inorganic particles, the amide-imide resin (A) is a reaction product of an isocyanurate-type polyisocyanate synthesized from an isocyanate having an aliphatic structure and a tricarboxylic anhydride having an aliphatic structure and has a number-average molecular weight of 500 to 1000.

When the curable resin composition of the present invention has the above-described constitution, a cured product thereof has excellent heat resistance and low warpage, and furthermore, light transmittance, particularly visible light transmittance in the cured product is good. In addition, the curable composition of the present invention has good lamination properties, and residual stress in the cured product is suppressed.

That is, the curable resin composition of the present invention exhibits good heat resistance and suppresses the occurrence of a warp when cured and is thus meaningful in application where, particularly, a low level of colorability is desired in uses, for example, as an interlayer insulating material in printed wiring boards and the like and as an insulating material for rewiring.

Hereinafter, each component of the curable resin composition will be described in detail.

[(A) Amide-Imide Resin]

The curable resin composition of the present invention contains (A) an amide-imide resin.

The amide-imide resin (A) is a resin that is produced by reacting an isocyanurate-type polyisocyanate synthesized from an isocyanate having an aliphatic structure and a tricarboxylic anhydride having an aliphatic structure, and an amide-imide resin having a number-average molecular weight within a range of 500 to 1000 is used. That is, in the amide-imide resin (A) that is used in the present invention, an imide bond is directly formed from the above-described isocyanurate-type polyisocyanate and tricarboxylic anhydride, which makes it possible to synthesize an amide-imide resin that is good in stability, reproducibility and solubility of the material and excellent in transparency compared with amide-imide resins synthesized by the related art where a polyamic acid intermediate is produced in the middle. In addition, the number-average molecular weight of the amide-imide resin (A) is set within a range of 500 to 1000, whereby the resin has a relatively low viscosity, an easy-to-disperse property, a decreased melt viscosity during lamination, and also good lamination properties. In addition, due to an imide skeleton that the amide-imide resin (A) has, the heat resistance of the curable composition improves. Neither the isocyanurate-type polyisocyanate nor the tricarboxylic anhydride has a structure including an aromatic ring structure. Therefore, an amide-imide resin according to the present invention to be obtained is highly transparent, and furthermore, a cured product to be obtained from the curable resin composition of the present invention containing the amide-imide resin is also highly transparent.

[Isocyanurate-Type Polyisocyanate]

The isocyanurate-type polyisocyanate, which is considered as a synthesis raw material of the amide-imide resin (A), is synthesized from an aliphatic isocyanurate, that is, an aliphatic linear isocyanate (for example, hexamethylene diisocyanate or trimethylhexamethylene isocyanate) or an alicyclic isocyanate (isophorone diisocyanate, hydrogenated tolylene diisocyanate, hydrogenated xylene diisocyanate, norbornane diisocyanate or hydrogenated diphenylmethane diisocyanate).

Specific examples of the isocyanurate-type polyisocyanate are

HDI3N: isocyanurate-type triisocyanate synthesized from hexamethylene diisocyanate, HTMDI3N: isocyanurate-type triisocyanate synthesized from trimethylhexamethylene diisocyanate, IPDI3N: isocyanurate-type triisocyanate synthesized from isophorone diisocyanate, HTDI3N: isocyanurate-type triisocyanate synthesized from hydrogenated tolylene diisocyanate, HXDI3N: isocyanurate-type triisocyanate synthesized from hydrogenated xylene diisocyanate, NBDI3N: isocyanurate-type triisocyanate synthesized from norbornane diisocyanate and HMDI3N: isocyanurate-type triisocyanate synthesized from hydrogenated diphenylmethane diisocyanate.

Each of the above-described triisocyanurates may be used singly or may be used in combination.

The isocyanate, which serves as a raw material of the amide-imide resin (A), is preferably an alicyclic isocyanate, particularly, isophorone diisocyanate. When an alicyclic isocyanate is used, the Tg of the amide-imide resin (A) is improved, and a cured coated film excellent in thermal properties and transparency in particular can be obtained from the curable resin composition containing the alicyclic isocyanate.

[Aliphatic Tricarboxylic Anhydride]

Examples of an aliphatic tricarboxylic anhydride that is another reaction raw material of the amide-imide resin (A) include particularly, alicyclic tricarboxylic anhydrides, for example, cyclohexanetricarboxylic anhydride, methylcyclohexanetricarboxylic anhydride, cyclohexene tricarboxylic anhydride, and methylcyclohexene tricarboxylic anhydride. Cyclohexanetricarboxylic anhydride is particularly preferably used.

Cyclohexanetricarboxylic anhydride is preferably represented by the following formula (1),

[Formula 1]

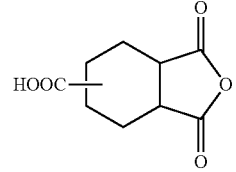

(1)

specific examples thereof may include cyclohexane-1,3,4-tricarboxylic acid-3,4-anhydride, cyclohexane-1,3,5-tricarboxylic acid-3,5-anhydride, cyclohexane-1,2,3-tricarboxylic acid-2,3-anhydride and the like, particularly, cyclohexane-1,3,4-tricarboxylic acid-3,4-anhydride.

That is, the use of such an aliphatic tricarboxylic anhydride as a raw material of the amide-imide resin (A) makes the heat resistance of a cured product of the present invention more excellent.

In addition, as the raw material for the production of the amide-imide resin (A), it is also possible to use the aliphatic tricarboxylic anhydride and, in some cases, jointly use a bifunctional dicarboxylic acid compound, for example, an aliphatic or aromatic dicarboxylic acid, for example, sebacic acid, phthalic acid, fumaric acid, maleic acid, an acid anhydride thereof, or the like.

When a carboxylic acid component of the tricarboxylic anhydride and an isocyanate component in the isocyanurate-type polyisocyanate react with each other, an imide and an amide are formed, and as the resin of the present invention an amide-imide resin is produced. When the isocyanurate-type polyisocyanate and the tricarboxylic anhydride react with each other, an imide bond is formed from an acid anhydride group and an isocyanate group, and an amide bond is formed from a carboxyl group and an isocyanate group. When a tricarboxylic acid anhydride group and a polyisocyanate group are reacted in fractions where a carboxylic acid (carboxyl group) component of the tricarboxylic anhydride is left, a polyamide-imide resin to be obtained has a carboxy group. This carboxy group reacts with a polymerizable group such as an epoxy group of an epoxy resin that is contained in the curable resin composition of the present invention, which will be described below, and forms a crosslinking structure of a cured product. In the reaction between the tricarboxylic anhydride and the triisocyanate, two types of reactions such as amidation and imidization described above can be considered. Since the reaction rate is faster in imidization, tricarboxylic acid selectively forms an imide in a phase of the acid anhydride group.

The isocyanurate-type polyisocyanate synthesized from an isocyanate having an aliphatic structure and the tricarboxylic anhydride having an aliphatic structure are more preferably reacted such that a ratio $[(M1)+(M2)/(N)]$ between the mole number of the isocyanate group of the isocyanurate-type polyisocyanate synthesized from an isocyanate having an aliphatic structure (N) and the total mole number of the mole number of the carboxy group (M1) and the mole number of the acid anhydride group (M2) in the tricarboxylic anhydride having an aliphatic structure becomes 1.1 to 3 since the polarity of the reaction system increases, thereby the reaction smoothly proceeds, no isocyanate group is left, the stability of the resulting polyimide resin is good, the amount of the tricarboxylic anhydride left is also small, a separation problem such as recrystallization is also less likely to be caused, and the like. Particularly, the ratio is more preferably 1.2 to 2. The acid anhydride group in the present invention indicates a —CO—O—CO— group obtained by the intramolecular dehydration condensation of two carboxylic acid molecules.

An imidization reaction is preferably caused by mixing one or more types of isocyanates having an aliphatic structure and one or more types of tricarboxylic anhydrides in a solvent or without a solvent and heating the components under stirring. The reaction temperature is preferably 50° C. to 250° C. and particularly preferably 70° C. to 180° C. As such a reaction temperature is set, the reaction rate is faster, and the effect that side reaction, decomposition or the like is less likely to occur is exhibited. In the reaction, the acid anhydride group and the isocyanate group form an imide group while accompanying decarboxylation. The proceeding of the reaction can be traced with analysis means such as an infrared spectrum, an acid value, and quantitative estimation of the isocyanate group. In the infrared spectrum, 2270 $cm^{-1}$ that is the characteristic absorption of the isocyanate group decreases with the reaction, and furthermore, the acid anhydride group having characteristic absorption at 1860 $cm^{-1}$ and 850 $cm^{-1}$ decreases. On the other hand, the absorption of the imide group increases at 1780 $cm^{-1}$ and 1720 $cm^{-1}$. The reaction may be ended by lowering the temperature while confirming the target acid value, viscosity, molecular weight or the like. However, the reaction is more preferably continued until the isocyanate group disappears from the viewpoint of stability over time or the like. In addition, a catalyst, an antioxidant, a surfactant, other solvents or the like may be added in the middle of the reaction or after the reaction as long as the physical properties of a resin to be synthesized are not impaired.

The acid value of the amide-imide resin of the present invention is preferably 70 to 210 KOHmg/g and particularly preferably 90 to 190 KOHmg/g. When the acid value is 70 to 210 KOHmg/g, excellent performance is exhibited as curing properties.

In addition, the amide-imide resin of the present invention is preferably an amide-imide resin that dissolves in a polar solvent containing neither a nitrogen atom nor a sulfur atom. An example of such an amide-imide resin includes a branched amide-imide resin having a branched structure and an acid value of the resin of 60 KOHmg/g or higher.

The number-average molecular weight Mn of the amide-imide resin (A) in the curable resin composition is set in a range of 500 to 1000, preferably, 700 to 900.

In the present invention, as the number-average molecular weight Mn of the amide-imide resin (A) is 500 or more, the heat resistance of a cured coated film is good, and as the number-average molecular weight Mn is 1000 or less, the resin has a relatively low viscosity, an easy-to-disperse property, a decreased melt viscosity during lamination, and good lamination properties.

As the number-average molecular weight in the present invention, unless particularly otherwise described, a measurement result of gel permeation chromatography (GPC) using the polystyrene standard is used.

The content of the amide-imide resin (A) may be 30 to 85 mass %, particularly preferably 40 to 70 mass %, with respect to the total mass of the solid content of the curable resin composition. This is because, when the amount of the amide-imide resin (A) blended is set within this range, the Tg of the curable resin composition improves, and a cured coated film having excellent thermal properties can be obtained.

[(B) Thermosetting Resin]

The curable resin composition of the present invention further contains (B) a thermosetting resin.

As the thermosetting resin (B), for example, an epoxy compound, an oxetane compound or an episulfide compound, particularly, a polyfunctional epoxy compound, oxetane compound or episulfide resin having two or more cyclic ether groups and/or cyclic thioether groups in one molecule is used. Furthermore, examples thereof also include well-known thermosetting resins such as a (block) isocyanate compound, particularly, a polyisocyanate compound having two or more isocyanate groups or blocked isocyanate groups in one molecule; an amine resin including a melamine resin and a benzoguanamine resin and a derivative thereof; bismaleimide; oxazine; a cyclocarbonate compound; and a carbodiimide resin. In the present invention, an epoxy compound is preferably used, and a polyfunctional epoxy compound is particularly preferably used. The amide-imide resin (A) of the present invention has a carboxyl group and reacts with the epoxy compound to be capable of relaxing residual stress that is generated during curing, which makes it possible to suppress a base material being warped in a case where a cured coated film of the curable resin composition of the present invention has been formed on the base material.

The epoxy resin that is used may have a liquid form or may have a solid form or a semisolid form. Examples of the polyfunctional epoxy compound include a bisphenol A-type epoxy resin; a brominated epoxy resin; a novolac-type epoxy resin; a bisphenol F-type epoxy resin; a hydrogenated bisphenol A-type epoxy resin; a glycidylamine-type epoxy resin; a hydantoin-type epoxy resin; an alicyclic epoxy resin; a trihydroxyphenylmethan-type epoxy resin; a bixylenol-type or biphenol-type epoxy resin or a mixture of these; a bisphenol S-type epoxy resin; a bisphenol A novolac-type epoxy resin; a tetraphenylol ethane-type epoxy resin; a heterocyclic epoxy resin; a diglycidyl phthalate resin; a tetraglycidyl xylenoylethane resin; a naphthalene group-containing epoxy resin; an epoxy resin having a dicyclopentadiene skeleton; a glycidyl methacrylate copolymerized epoxy resin; a copolymerized epoxy resin of cyclohexyl maleimide and glycidyl methacrylate; an epoxy-modified polybutadiene rubber derivative; and a CTBN-modified epoxy resin, but the polyfunctional epoxy compound is not limited thereto. As the epoxy resin, a bisphenol A-type or bisphenol F-type novolac-type epoxy resin, a bixylenol-type epoxy resin, a biphenol-type epoxy resin, a biphenol novolac-type epoxy resin, a naphthalene-type epoxy resin, a biphenyl-type epoxy resin (for example, a biphenyl aralkyl-type epoxy resin) or a mixture of these is preferably used.

An epoxy resin having an aromatic ring skeleton (for example, a biphenyl skeleton) is preferable from the viewpoint of improving the heat resistance, and an epoxy resin having a dicyclopentadiene skeleton is preferable from the viewpoint of improving the transmittance.

Examples of the epoxy resin having an aromatic ring skeleton include an epoxy resin having a naphthalene skeleton, particularly, an epoxy resin having an aralkyl-type naphthalene skeleton, and an epoxy resin having a biphenyl skeleton, particularly, a biphenyl aralkyl-type epoxy resin. Between them, in the epoxy resin having a naphthalene skeleton, naphthalene has a planar structure, and it is possible to further improve the heat resistance by decreasing the linear expansion coefficient of a cured product. Examples of a commercially available product of the epoxy resin having a naphthalene skeleton include ESN-190 and ESN-360 manufactured by Nippon Steel Chemical & Material Co., Ltd., EPICLON HP-4032 and EPICLON HP-4032D manufactured by DIC Corporation and NC-7000L manufactured by Nippon Kayaku Co., Ltd. The epoxy resin having a biphenyl skeleton is also capable of improving the heat resistance and low linear expansion of a cured product of a composition containing the epoxy resin having a biphenyl skeleton. Examples of a commercially available product of the epoxy resin having a biphenyl skeleton include NC-3000, NC-3000-L, NC-3000-H, NC-3001 and NC-2000-L manufactured by Nippon Kayaku Co., Ltd.

Furthermore, examples of an epoxy resin having an alicyclic skeleton include an epoxy resin having a dicyclopentadiene skeleton. From this epoxy resin having an alicyclic skeleton, a glass transition temperature improvement effect can be expected more than from an epoxy resin having a chain-like skeleton. As examples of a commercially available product of the epoxy resin having a dicyclopentadiene skeleton, there are EPICLON® HP-7200, HP-7200-H and HP-7200-L manufactured by DIC Corporation and XD-1000 manufactured by Nippon Kayaku Co., Ltd.

The thermosetting resin as described above may be used singly or two or more thermosetting resins may be used in combination.

In the case of using the thermosetting resin (B), when the amount of the thermosetting resin (B) to be blended is set at 20 to 60 parts by mass, particularly, 30 to 50 parts by mass with respect to 100 parts by mass of the solid content of the curable resin composition, a cured product of the curable resin composition is extremely excellent in heat resistance, low residual stress and low warpage.

[(C) Thermosetting Accelerator]

The thermosetting accelerator (C) that is used in the present invention can be arbitrarily selected from a tertiary amine, a tertiary amine salt, a quaternary onium salt, a tertiary phosphine, an imidazole derivative or a crown ether complex (for example, 18-crown-6/potassium phenoxide, potassium benzo ether, KCl, KBr, ammonium acetate or the like), and these may be used singly or two or more thereof may be mixed and used. Additionally, phosphonium ylide or the like can also be used. Examples of the tertiary amine include triethylamine, tributylamine, DBU (1,8-diazabicyclo[5.4.0]undec-7-ene), DBN (1,5-diazabicyclo[4.3.0]non-5-ene), DABCO (1,4-diazabicyclo[2.2.2]octane), pyridine, and N,N'-dimethyl-4-aminopyridine. Examples of the tertiary amine salt include U-CAT series manufactured by San-Apro Ltd. Furthermore, a quaternary onium salt that is formed by an addition reaction between a tertiary amine or a tertiary phosphine and carboxylic acid or a highly acidic phenol can also be used as a reaction accelerator. These components may form a quaternary salt before being added to the reaction system or may be each separately added to form a quaternary salt in the reaction system, both procedures being applicable. Specifically, tributylamine acetate that is obtained from tributylamine and acetic acid, triphenylphosphine acetate that is formed from triphenylphosphine and acetic acid and the like are exemplified. Examples of the quaternary onium salt include an ammonium salt, a phosphonium salt, an arsonium salt, a stibonium salt, an oxonium salt, a sulfonium salt, a selenonium salt, a stannonium salt, and an iodonium salt. Particularly preferable are a quaternary ammonium salt and a quaternary phosphonium salt. Specific examples of the quaternary ammonium salt include tetra-n-butylammonium chloride (TBAC), tetra-n-butylammonium bromide (TBAB), tetra-n-butylammonium iodide (TBAI), and tetra-n-butylammonium acetate (TBAAc). Specific examples of the quaternary phosphonium salt include tetra-n-butylphosphonium chloride (TBPC), tetra-n-butylphosphonium bromide (TBPB), tetra-n-butylphosphonium iodide (TBBI), tetraphenylphosphonium chloride (TPPC), tetraphenylphosphonium bromide (TPPB), tetraphenylphosphonium iodide (TPPI), ethyltriphenylphosphonium bromide (ETPPB), and ethyltriphenylphosphonium acetate (ETPPAc). The tertiary phosphine needs to be a trivalent organic phosphorus compound having an alkyl group or aryl group having 1 to 12 carbon atoms. Specific examples thereof include triethylphosphine, tributylphosphine, and triphenylphosphine. Examples of the imidazole derivative include imidazole, 2-methylimidazole, 2-ethylimidazole, 2-ethyl-4-methylimidazole, 2-phenylimidazole, 4-phenylimidazole, 1-cyanoethyl-2-phenylimidazole, and 1-(2-cyanoethyl)-2-ethyl-4-methylimidazole. Specific examples of a commercially available product thereof include CUREZOL 2MZ-A, 2MZ-OK, 2PHZ, 2P4BHZ, 2P4MHZ and 2E4MZ manufactured by Shikoku Chemicals Corporation. In addition, examples of an imidazole derivative intended to improve stability over time include NOVA-CURE HX-3721, HX-3748, HX-3741, HX-3088, HX-3722, HX-3742, HX-3921HP, HX-3941HP and HX-3613 manufactured by Asahi Kasei Corporation. As the phosphonium ylide, a well-known phosphonium ylide can be used as long as the phosphonium ylide is a compound that is obtained by a reaction between a phosphonium salt and a base, but a highly stable phosphonium ylide is preferable from the viewpoint of easiness in handling. Specific examples thereof include (formylmethylene)triphenylphosphine, (acetylmethylene)triphenylphosphine, (pivaloylmethylene)triphenylphosphine, (benzoylmethylene)triphenylphosphine, (p-methoxybenzoylmethylene)triphenylphosphine, (p-methylbenzoylmethylene)triphenylphosphine, (p-nitrobenzoylmethylene)triphenylphosphine, (naphthoyl)triphenylphosphine, (methoxycarbonyl)triphenylphosphine, (cliacetylmethylene)triphenylphosphine, (acetylcyano)triphenylphosphine, and (dicyanomethylene)triphenylphosphine.

The amount of the thermosetting accelerator (C) used is, for example, within a range of 0.1 to 25 mol %, preferably 0.5 to 20 mol % and more preferably 1 to 15 mol % with respect to 1 mole of the epoxy group. When the amount of the thermosetting accelerator used is set to an amount of 0.1 mol % or more with respect to the epoxy group, it is easy for the reaction to proceed at a more practical rate. On the other hand, the amount of the thermosetting accelerator used is ordinarily set to 25 mol % or less from the viewpoint of a reaction acceleration effect and the economic efficiency.

[(D) Inorganic Particles]

The curable resin composition of the present invention contains (D) inorganic particles.

Specific examples thereof may include inorganic particles (D) of a non-metallic filler such as silica, barium sulfate, calcium carbonate, silicon nitride, aluminum nitride, boron nitride, alumina, magnesium oxide, aluminum hydroxide, magnesium hydroxide, titanium oxide, mica, talc, Neuburg silica and organic bentonite, copper, gold, silver, palladium, and silicon.

In the curable resin composition of the present invention, these inorganic particles (D) may be used singly or two or more types thereof may be jointly used. In the present invention, barium sulfate, silica or both is preferably used.

In order for a cured product to appear transparent, the average particle diameter of the inorganic particles (D) needs to be set to ½ or less of the wavelength of the visible light and is 200 nm or less, preferably 150 nm or less and more preferably 100 nm or less. In the uses of the curable resin composition of the present invention and a cured product thereof, the cured product is preferably transparent or almost transparent, and, in order for that, it is usual to use inorganic particles having an average particle diameter of 200 nm or less. In order to obtain an uncolored transparent color, the average particle diameter of the inorganic particles is preferably set to 100 nm or less. That is, as the average particle diameter decreases, the visible light is more likely to be transmitted, and the inorganic particles (D) absorb light in a necessary visible range for coloring and transmits light outside the visible light range, which makes the inorganic particles (D) transparent.

Here, the average particle diameter is a value measured by the laser diffraction method. Examples of a measuring instrument for which the laser diffraction method is used include NANOTRAC WAVE manufactured by Nikisso Co., Ltd.

When the average particle diameter of the inorganic particles in the cured product is measured, the surface of the cured product is first etched by a plasma treatment to make the inorganic particles visible, and then the inorganic particles are observed with a scanning electron microscope (SEM). In order to obtain the average particle diameter of the inorganic particles, the diameters of inorganic particles that are observed in a 1 $\mu m^2$ range are measured, this operation is performed five times in the same and additional places, and the average value of the diameters of the inorganic particles is calculated. For the plasma treatment, for example, March Plasma Systems Inc. AP-1000 is used as a device, the power is set to 500 W, the pressure is set to 300 Torr, Ar gas is used, and the treatment time is set to 10 minutes.

The content of these inorganic particles (D) is 5 to 60 mass % and particularly preferably set to 10 to 50 mass % with respect to the total mass of the solid content of the curable resin composition of the present invention. When the amount of the inorganic particles (D) blended is appropriately selected depending on the type thereof, it is possible to improve the heat resistance without degrading the transparency of a cured coated film.

In the case of using silica as the inorganic particles (D) in the resin composition of the present invention, silica surface-treated with a silane coupling agent can be used. This is because the silica, after being dispersed in liquid, can be prevented from deposition or agglomeration and, consequently, the storage stability is excellent. In addition, this is because, even in blending it into the resin composition, the silica can be stably injected without agglomeration, and also a wettability between the cured resin formed later and the particles can be improved.

Examples of an organic group that is contained in the silane coupling agent include vinyl group, epoxy group, styryl group, methacryloxy group, acryloxy group, amino group, ureido group, chloropropyl group, mercapto group, polysulfide group, and isocyanate group. One silane coupling agent may be used singly or two or more silane coupling agents may be jointly used.

[Carboxyl Group-Containing Resin]

The curable resin composition of the present invention may contain a carboxyl group-containing resin, if necessary. The carboxyl group-containing resin is a compound having a different structure from the above-described amide-imide resin (A) and has no amide-imide structures, and a resin having a carboxyl group in the molecule can be used. Specific examples of the carboxyl group-containing resin include the following (E1) to (E10):

Specific examples of a non-photosensitive carboxyl group-containing resin may include compounds as described below (either an oligomer or a polymer).

(E1) A carboxyl group-containing resin obtained by copolymerization of an unsaturated carboxylic acid such as (meth)acrylic acid and an unsaturated group-containing compound such as styrene, α-methylstyrene, lower alkyl (meth)acrylate and isobutylene.

(E2) A carboxyl group-containing urethane resin obtained by a polyaddition reaction between a diisocyanate such as aliphatic diisocyanate, branched aliphatic diisocyanate, alicyclic diisocyanate and aromatic diisocyanate and a diol compound such as a carboxyl group-containing dialcohol compound including dimethylolpropionic acid and dimethylolbutanoic acid and a compound having a phenolic hydroxyl group and an alcoholic hydroxyl group including a polycarbonate-based polyol, a polyether-based polyol, a polyester-based polyol, a polyolefin-based polyol, an acrylic polyol and a bisphenol A-based alkylene oxide adduct diol.

(E3) A terminal carboxyl group-containing urethane resin obtained by reacting an acid anhydride with a terminal of an urethane resin by a polyaddition reaction between a diisocyanate compound such as aliphatic diisocyanate, branched aliphatic diisocyanate, alicyclic diisocyanate or aromatic diisocyanate and a diol compound such as a compound having a phenolic hydroxyl group and an alcoholic hydroxyl group including a polycarbonate-based polyol, a polyether-based polyol, a polyester-based polyol, a polyolefin-based polyol, an acrylic polyol and a bisphenol A-based alkylene oxide adduct diol.

(E4) A carboxyl group-containing a photosensitive urethane resin obtained by a polyaddition reaction between a diisocyanate; a (meta)acrylate of a Bifunctional epoxy resin such as a bisphenol A-type epoxy resin, a hydrogenated bisphenol A-type epoxy resin, a bisphenol F-type epoxy resin, a bisphenol S-type epoxy resin, a bixylenol-type epoxy resin and a biphenol-type epoxy resin or a partially acid anhydride-modified product of the (meth)acrylate; a carboxyl group-containing dialcohol compound; and a diol compound.

(E5) A carboxyl group-containing photosensitive urethane resin having a terminal-(meth)acrylate modification, obtained by adding a compound containing one hydroxyl group and one or more (meth)acryloyl group(s) in the molecule such as hydroxyalkyl (meth)acrylate, during the synthesis of the above-described resin (E2) or (E4).

(E6) A carboxyl group-containing photosensitive urethane resin having a terminal-(meth)acrylate modification obtained by adding a compound containing one isocyanate group and one or more (meth)acryloyl group(s) in the molecule such as an equimolar reaction product of isophorone diisocyanate and pentaerythritol triacrylate, during the synthesis of the above-described resin (E2) or (E4).

(E7) A carboxyl group-containing photosensitive resin, obtained by reaction of a (meth)acrylic acid with a polyfunctional, i.e., Bifunctional or higher-functional epoxy compound as described below, and addition of a dibasic acid anhydride such as phthalic anhydride, tetrahydrophthalic anhydride and hexahydrophthalic anhydride to a hydroxyl group(s) present as a side chain(a) in the reaction product of the (meth)acrylic acid with the polyfunctional epoxy compound. Here, it is preferable to use the epoxy resin in a solid form.

(E8) A carboxyl group-containing photosensitive resin obtained by reaction of (meth)acrylic acid is reacted with a polyfunctional epoxy compound wherein a hydroxyl group of a difunctional epoxy resin as described below had been further epoxidized with epichlorohydrin, and addition of a dibasic acid anhydride to the resultant hydroxyl group. Here, it is preferable to use the epoxy resin in a solid form.

(E9) A carboxyl group-containing photosensitive resin obtained by addition of a cyclic ether such as ethylene oxide or a cyclic carbonate such as propylene carbonate to a polyfunctional phenol compound such as novolac, reaction of the resultant hydroxyl groups with a (meth)acrylic acid for a partial esterification of the hydroxyl groups, and a reaction of the the remaining hydroxyl groups with a polybasic acid anhydride.

(E10) A carboxyl group-containing photosensitive resin obtained by addition of a compound having one epoxy group and one or more (meth)acryloyl groups in the molecule such as glycidyl (meth)acrylate, or α-methylglycidyl (meth)acrylate to one of the above resins (E1) to (E9).

(E11) A carboxyl group-containing photosensitive resin obtained by reaction of an unsaturated group-containing monocarboxylic acid such as (meth)acrylate with a reaction product such as a polyalcohol resin which had been obtained by reacting a compound having a plurality of phenolic hydroxy groups in one molecule, that is, a polyphenol compound (for example, phenol novolac or cresol novolac) with an alkylene oxide such as ethylene oxide and propylene oxide, and a further reaction of the resultant reaction product with a polybasic acid anhydride.

(E12) A carboxyl group-containing photosensitive resin obtained by reaction of an unsaturated group-containing monocarboxylic acid with a reaction product which had been obtained by reacting a polyphenol compound (for example, phenol novolac or cresol novolac) and a cyclic carbonate compound such as ethylene carbonate and propylene carbonate, and reaction of the resultant product with a polybasic acid anhydride.

In the present invention, a photosensitive carboxyl group-containing photosensitive resin having a polyphenol skeleton such as (E11) and (E12) described above is preferably used.

The carboxyl group-containing resin may be used singly or two or more carboxyl group-containing resins may be used in combination, but the total mass is preferably 1 part by mass or more and 40 parts by mass or less with respect to 100 parts by mass of the solid content of the amide-imide resin (A). In such a case, the number of solvents that can be selected for the curable resin composition increases, and the workability improves.

[Other Components]

To the curable resin composition of the present invention, components other than the above-described components can be added as long as the effect of the present invention is not impaired. As additives, a silicone-based or fluorine-based defoamer, a leveling agent, a thermosetting accelerator, a thermal polymerization inhibitor, an ultraviolet absorber, a solvent, a silane coupling agent, a plasticizer, a foaming agent, a flame retardant, an antistatic agent, an anti-aging agent, an antibacterial and antifungal agent and the like can be blended.

In order to obtain an appropriate viscosity for applying the curable resin composition to substrates or carrier films, a solvent can be used. As such a solvent, an organic solvent is mainly used, and specific examples thereof include ketones, aromatic hydrocarbons, glycol ethers, glycol ether acetates, esters, alcohols, aliphatic hydrocarbons, and petroleum-based solvents. More specific examples thereof include ketones such as methyl ethyl ketone and cyclohexanone; aromatic hydrocarbons such as toluene, xylene and tetramethylbenzene; glycol ethers such as cellosolve, methyl cellosolve, butyl cellosolve, carbitol, methyl carbitol, butyl carbitol, propylene glycol monomethyl ether, dipropylene glycol monomethyl ether, dipropylene glycol diethyl ether and triethylene glycol monoethyl ether; esters such as ethyl acetate, butyl acetate, dipropylene glycol methyl ether acetate, propylene glycol methyl ether acetate, propylene glycol ethyl ether acetate and propylene glycol butyl ether acetate; alcohols such as ethanol, propanol, ethylene glycol and propylene glycol; aliphatic hydrocarbons such as octane and decane; and petroleum-based solvents such as petroleum ether, petroleum naphtha, hydrogenated petroleum naphtha and solvent naphtha. One type of such an organic solvent may be used singly or two or more types thereof may be used in combination.

The curable resin composition of the present invention may have a liquid form or may have a dry film form that is obtained by drying a liquid-form resin composition. The liquid-form resin composition may be a two-component liquid form or the like from the viewpoint of storage stability, but may be a one-component liquid form. Hereinafter, a dry film will be described in detail as one use aspect of the curable resin composition.

[Production of Dry Film]

A dry film of the present invention has a resin layer obtained by applying the curable resin composition of the present invention onto a film (hereinafter, also referred to as "carrier film") and then drying the curable resin composition. The dry film of the present invention can be obtained by diluting the curable resin composition of the present invention with an organic solvent to adjust the viscosity to an appropriate viscosity, applying the curable resin composition on the carrier film in a uniform thickness with a comma coater, a blade coater, a lip coater, a rod coater, a squeeze coater, a reverse coater, a transfer roll coater, a gravure coater, a spray coater or the like and drying the curable resin composition, usually, at a temperature of 50° C. to 130° C. for one to 30 minutes. The coated film thickness is not particularly limited; however, generally, the coated film thickness needs to be appropriately set in a range of 3 to 100 μm, preferably 5 to 40 μm, in terms of the dried film thickness.

As the carrier film, a plastic film can be preferably used, and a plastic film such as a polyester film including polyethylene terephthalate, a polyimide film, a polyamide-imide film, a polypropylene film or a polystyrene film is preferably used. The thickness of the carrier film is not particularly limited, but is, ordinary, appropriately selected within a range of 10 to 150 μm.

After the curable resin composition of the present invention is applied to and dried on the carrier film, a peelable film (hereinafter, also referred to as "cover film") may be further laminated on the surface of the coated film for the purpose of preventing the attachment of dust to the surface of the coated film or the like. As the peelable cover film, for example, a polyethylene film, a polytetrafluoroethylene film, a polypropylene film, surface-treated paper or the like can be used, and in peeling off the cover film, the adhesive force between the coated film and the cover film needs to be weaker than the adhesive force between the coated film and the carrier film.

A drying treatment that is performed after the application of the curable resin composition of the present invention onto the carrier film is performed using a hot air circulation-type drying furnace, an IR furnace, a hot plate, a convection oven or the like, whereby the dry film is obtained.

In the case of directly applying the curable resin composition onto a substrate, as a base material, in addition to a printed wiring board on which a circuit has been formed in advance or a flexible printed wiring board, copper-clad laminates of all grades (FR-4 and the like) for which a material of a copper-clad laminate for a high-frequency circuit, for which paper phenol, paper epoxy, glass fabric epoxy, glass polyimide, glass fabric/non-woven fabric epoxy, glass fabric/paper epoxy, synthetic fiber epoxy, fluorine/polyethylene/polyphenylene ether, polyphenylene oxide/cyanate ester or the like is used or the like is used, additionally, a polyimide film, a PET film, a glass substrate, a ceramic substrate, a wafer plate and the like can be exemplified.

[Production of Cured Product]

A cured product (cured film) for which the curable resin composition of the present invention is used is produced as described below. That is, first, the curable resin composition is diluted with a solvent as necessary and then applied onto a substrate. Regarding the formation of a coated film of the curable resin composition, a resin layer obtained by volatilizing and drying the solvent is heated at a temperature of approximately 100° C. to 180° C. for 30 minutes to 60 minutes and thermally cured, whereby a cured coated film is formed.

As a coating method, an arbitrary method such as a clip coating method, a flow coating method, a bar coating method and a screen printing method can be applied.

The volatilization and drying of the solvent and the thermal curing of the resin layer, which are performed after the application of the curable resin composition, can be performed using a hot air circulation-type drying furnace, an IR furnace, a hot plate, a convection oven or the like (a method in which a hot air in a dryer is counter-currently brought into contact using a device including a heat source in which an air is heated by steam and a method in which the air is blown to a support from a nozzle).

The curable resin composition of the present invention enables the light transmittance at a wavelength of 450 nm of a cured coated film having a film thickness of 20 μm that is obtained from the curable resin composition to be set to 95% or greater. Such excellent light transmittance can be obtained using the amide-imide resin (A) having a low molecular weight that is obtained from the above-described predetermined raw materials in the curable resin composition of the present invention and is achieved by having, particularly, an aliphatic structure. Therefore, the cured coated film is visually recognized colorlessly transparent or in an almost colorlessly transparent state.

In addition, according to the curable resin composition of the present invention, it is possible to suppress residual stress in the cured coated film that is obtained from the curable resin composition at less than 25 MPa. The decrease in the residual stress in the cured coated film results from a reaction between the thermosetting resin (B) and the carboxyl group-containing resin particularly in a case where the curable composition of the present invention contains the carboxyl group-containing resin. In addition, in a case where the curable composition contains, in addition to the carboxyl group-containing resin, an epoxy compound as the curable resin (B), in a cured coated film that is obtained by particularly a curing reaction between the carboxyl group of the acid anhydride and the epoxy group, residual stress is relaxed while the strength of the coated film is maintained.

The curable resin composition of the present invention can be applied to electronic components. An electronic component of the present invention means a component that is used in electronic circuits, includes not only an active component such as a printed wiring board, a light-emitting diode and a laser diode but also a passive component such as a resistance, a condenser, an inductor and a connector, and is a component where the cured coated film of the curable composition of the present invention exhibits the effect of the present invention. The curable resin composition of the present invention is preferable for forming, particularly, insulating cured films in printed wiring boards and more preferable for forming permanent insulating films for coverlays, solder masks, interlayer insulating materials, insulating materials for forming rewiring layers and the like.

Electronic components including the cured product obtained from the curable resin composition of the present invention are capable of sufficiently exhibiting functions as electronic components since the resolution and heat resistance of the cured product are excellent. In addition, the cured product obtained from the curable resin composition of the present invention is also excellent in chemical resistance, and therefore when it is washed with an acid or an alkali during the production of boards or washed with a solvent during mounting, the cured product does not cause degradation, deformation and the like due to the chemical to be used and is capable of maintaining and improving the accuracy of electronic components.

EXAMPLES

Hereinafter, the present invention will be described in more detail using examples and comparative examples. The present invention is not limited to the following examples, and "parts" and "%" in the following description are all mass-based unless particularly otherwise described.

[Synthesis of Raw Materials]

[Production of Amide-Imide Resin]

Synthesis Example 1: Synthesis of (A) Amide-Imide Resin 1

Diethylene glycol monoethyl ether acetate (EDGA) (5184 g), IPDI3N (isocyanurate-type triisocyanate synthesized from isophorone diisocyanate: NCO %=18.2) (2070 g, 3 mol) and cyclohexane-1,3,4-tricarboxylic acid-3,4-anhydride (1782 g, 9 mol) were added to a flask equipped with a stirring device, a thermometer and a condenser and heated up to 140° C. A reaction proceeded together with foaming. The components were reacted at this temperature for eight hours. The inside of the system turned into a light yellow liquid, as a result of measuring characteristic absorption in an infrared spectrum, 2270 $cm^{-1}$, which is the characteristic absorption of an isocyanate group, completely disappeared, and absorption of an imide group was confirmed at 1780 $cm^{-1}$ and 1720 $cm^{-1}$. The acid value was 140 KOHmg/g in terms of the solid content, and the molecular weight was a number-average molecular weight of 800 in terms of polystyrene. In addition, the concentration of a resin component was 40 mass %. A solution of this resin is regarded as a solution of an amide-imide resin 1.

Synthesis Example 2: Synthesis of (A') Amide-Imide Resin 2

Diethylene glycol monoethyl ether acetate (EDGA) (4628 g), IPDI3N (isocyanurate-type triisocyanate synthesized from isophorone diisocyanate: NCO %=18.2) (2070 g, 3 mol) and cyclohexane-1,3,4-tricarboxylic acid-3,4-anhydride (1386 g, 7 mol) were added to a flask equipped with a stirring device, a thermometer and a condenser and heated up to 140° C. A reaction proceeded together with foaming. The components were reacted at this temperature for eight hours. The inside of the system turned into a light yellow liquid, as a result of measuring characteristic absorption in an infrared spectrum, 2270 cm$^{-1}$, which is the characteristic absorption of an isocyanate group, completely disappeared, and absorption of an imide group was confirmed at 1780 cm$^{-1}$ and 1720 cm$^{-1}$. The acid value was 140 KOHmg/g in terms of the solid content, and the molecular weight was a number-average molecular weight of 5800 in terms of polystyrene. In addition, the concentration of a resin component was 40 mass %. A solution of this resin is regarded as a solution of an amide-imide resin 2.

Synthesis Example 3: Synthesis of (A")
Amide-Imide Resin 3

Diethylene glycol monoethyl ether acetate (EDGA) (3554 g), IPDI3N (isocyanurate-type triisocyanate synthesized from isophorone diisocyanate: NCO %=18.2) (2070 g, 3 mol) and 1,2,4-benzenetricarboxylic acid 1,2-anhydride (1333 g, 9 mol) were added to a flask equipped with a stirring device, a thermometer and a condenser and heated up to 140° C. A reaction proceeded together with foaming. The components were reacted at this temperature for eight hours. The inside of the system turned into a brown liquid, as a result of measuring characteristic absorption in an infrared spectrum, 2270 cm$^{-1}$, which is the characteristic absorption of an isocyanate group, completely disappeared, and absorption of an imide group was confirmed at 1780 cm$^{-1}$ and 1720 cm$^{-1}$. The acid value was 140 KOHmg/g in terms of the solid content, and the molecular weight was a number-average molecular weight of 800 in terms of polystyrene. In addition, the concentration of a resin component was 40 mass %.

A solution of this resin is regarded as a solution of an amide-imide resin 3.

The number-average molecular weights of the amide-imide resins 1 and 2 were measured by the gel permeation chromatography (GPC) (polystyrene standard) with the following measuring instrument under the following measurement conditions.

Instrument name: Manufactured by Waters Corporation, Waters 2695
Detector: Manufactured by Waters Corporation, 2414 differential refractive index (RI) detector
Column: Manufactured by Waters Corporation, HSPgel column for high-speed analysis, HRMB-L,
3 μm, 6 mm×150 mm×2, and
manufactured by Waters Corporation, HSPgel column,
HR 1.3 μm,
6 mm×150 mm×2
Measurement conditions:
Column temperature: 40° C.
Set temperature of RI detector: 35° C.
Developing solvent: Tetrahydrofuran
Flow rate: 0.5 ml/minute
Amount of sample: 10 μl
Concentration of sample: 0.5 wt %

Synthesis Example 4: Synthesis of Carboxyl
Group-Containing Resin

A novolac-type cresol resin (manufactured by Aica Kogyo Company, Limited, trade name "SHONOL CRG951", OH equivalent: 119.4) (119.4 g), potassium hydroxide (1.19 g) and toluene (119.4 g) were prepared in an autoclave including a thermometer, a nitrogen introduction and alkylene oxide introduction device and a stirring device, the inside of the system was substituted with nitrogen under stirring, and the temperature was raised by heating. Next, propylene oxide (63.8 g) was gradually added dropwise and reacted at 125° C. to 132° C. at 0 to 4.8 kg/cm2 for 16 hours. After that, the components were cooled to room temperature, 89% phosphoric acid (1.56 g) was added to and mixed with this reaction solution to neutralize potassium hydroxide, and a propylene oxide reaction solution of the novolac-type cresol resin (non-volatile component: 62.1%, hydroxyl value: 182.2 g/eq.) was obtained. In this reaction solution, an average of 1.08 mole of alkylene oxide was added per equivalent of a phenolic hydroxyl group. The obtained alkylene oxide reaction solution of the novolac-type cresol resin (293.0 g), acrylic acid (43.2 g), methanesulfonic acid (11.53 g), methylhydroquinone (0.18 g) and toluene (252.9 g) were prepared in a reactor including a stirrer, a thermometer and an air blowing pipe, an air was blown into the reactor at a rate of 10 ml/minute and reacted at 110° C. for 12 hours under stirring. Water generated from the reaction was an azeotropic mixture with toluene, and water (12.6 g) was distilled. After that, the components were cooled to room temperature, and the obtained reaction solution was neutralized with a 15% sodium hydroxide aqueous solution (35.35 g) and then washed with water. After that, toluene was distilled while being substituted with diethylene glycol monoethyl ether acetate (118.1 g) with an evaporator, and a novolac-type acrylate resin solution was obtained. Next, the obtained novolac-type acrylate resin solution (332.5 g) and triphenylphosphine (1.22 g) were prepared in the reactor including a stirrer, a thermometer and an air blowing pipe, an air was blown into the reactor at a rate of 10 ml/minute, and tetrahydrophthalic anhydride (60.8 g) was gradually added under stirring and reacted at 95° C. to 101° C. for six hours. A carboxyl group-containing resin having an acid value of a solid substance of 88 mgKOH/g and a solid content of 71% was obtained.

Examples 1 to 5 and Comparative Examples 1 to 5

[Preparation of Curable Resin Compositions]

Individual components as shown in Table 1 were blended, preliminarily mixed with a stirrer, kneaded and dispersed with a triple roll mill, thereby preparing curable resin compositions according to examples and comparative examples.

In the table, amounts blended indicate parts by mass (in terms of the solid content).

<1. Heat Resistance>

The curable resin composition was diluted to an appropriate viscosity with methyl ethyl ketone and applied onto a carrier film (polyethylene terephthalate film). This was heated and dried with a hot air dryer at 80° C. for 30 minutes to form a curable resin composition layer having a thickness of 20 μm, and a cover film (polypropylene film) was attached onto a coated film, thereby obtaining a dry film. After that, the cover film was peeled off, thermally laminated on a copper foil and heated at 180° C. for 60 minutes to be cured. A cured coated film was peeled off from the obtained cured coated film-attached copper foil, thereby obtaining a cured coated film.

The glass transition temperature of the obtained cured coated film was measured under the following conditions.

Instrument: Dynamic viscoelasticity measuring instrument (DMA6100 manufactured by Seiko Instruments Inc.)
Measurement temperature: 30° C. to 300° C. (5° C./minute)
Frequency: 1 Hz
Glass transition temperature: The maximum value of measured tan δ is regarded as the glass transition temperature.

As the glass transition temperature increases, elastic changes occur at high temperatures, and thus the heat resistance is determined as more favorable.

Evaluation standards are as described below.
⊚: 190° C. or higher
○: 180° C. or higher
Δ: 170° C. or higher
x: Lower than 170° C.

<2. Residual Stress and Warp of Wafer>

The curable resin composition was diluted to an appropriate viscosity with methyl ethyl ketone and applied onto a carrier film (polyethylene terephthalate film). This was heated and dried with a hot air dryer at 80° C. for 30 minutes to form a curable resin composition layer having a thickness of 10 μm, and a cover film (polypropylene film) was attached onto a coated film, thereby obtaining a dry film.

Incidentally, the initial warp (average curvature radius), elastic modulus, thickness and Poisson ratio of a dummy silicon wafer that was used as a base material were measured in advance.

The dry film obtained in each example (one layer) was thermally laminated on the wafer with a laminator at a peak temperature of 100° C. and then heated at 180° C. for 60 minutes to be cured.

Therefore, a cured coated film was formed on the wafer. A warp (average curvature radius) of the wafer obtained as described above was measured.

The above-described average curvature radius, elastic modulus, thickness and Poisson ratio were measured with a thin film stress measuring instrument FLX-2320-s manufactured by Toho Technology Corp.

Residual stress was calculated from the following equation.

Residual stress={elastic modulus of wafer×(thickness of wafer)$^2$/(1−Poisson ratio of wafer)×6×thickness of cured coated film}×{1/curvature radius of wafer after formation of cured coated film−1/initial curvature radius of wafer}

<3. Lamination Properties>

The curable resin composition was diluted to an appropriate viscosity with methyl ethyl ketone and applied onto a carrier film (polyethylene terephthalate film). This was heated and dried with a hot air dryer at 80° C. for 30 minutes to form a curable resin composition layer having a thickness of 30 μm, and a cover film (polypropylene film) was attached onto a coated film, thereby obtaining a dry film (film thickness: 15 μm).

A both-sided printed wiring board having a fine circuit that had a copper thickness of 10 μm and was formed in a comb teeth pattern having L (line: wire width)/S (space: interval width)=5/5 μm and an aspect ratio of 2.0 was etched approximately 0.5 μm with a CZ-8101 treatment agent manufactured by MEC Company Ltd. as a pretreatment. Next, the 15 μm-thick dry film produced above was laminated on the treated both-sided printed wiring board on which L/S was formed using a batch-type vacuum pressurization laminator MVLP-500 (manufactured by Meiki Co., Ltd.). Regarding the lamination conditions, the dry film was heated and laminated under conditions of 5 kgf/cm$^2$, 100° C., one minute and 1 Torr and then levelled in a hot plate press step under conditions of 10 kgf/cm$^2$, 100° C. and one minute.

Whether or not an air entered the boundary portions between the lines and the spaces after the lamination and air bubbles (voids) were generated was visually confirmed after the carrier film was peeled off.

A: No voids were confirmed.
B: Several voids were confirmed.
C: The viscosity and the elastic modulus were high, and the resin layer of the dry film was not in contact with the bottom surfaces of the spaces in the evaluation board after the lamination.

<4. Transmittance>

The curable resin composition was diluted to an appropriate viscosity with methyl ethyl ketone and applied onto a glass substrate. This was heated and dried with a hot air dryer at 80° C. for 30 minutes to form a curable resin composition layer having a thickness of 20 μm and heated at 180° C. for 60 minutes to be cured. For transmittance measurement, a cured coated film-free glass substrate was regarded as a base, and the transmittance of the cured coated film-attached glass substrate at 450 nm was measured using a UV/VIS spectral photometer. Here, the transmittance was evaluated with reference to ISO13468 using an ultraviolet-visible spectral photometer (Ubest-V-570DS manufactured by JASCO Corporation) and an integrating sphere device (ISN-470 manufactured by JASCO Corporation).

Evaluation standards are as described below.
A: The transmittance is 98% or higher.
B: The transmittance is 95% or higher and lower than 98%.
C: The transmittance is 90% or higher and lower than 95%.
D: The transmittance is lower than 90%.

TABLE 1

| Component (only solid content) | Example 1 | Example 2 | Example 3 | Example 4 | Example 5 | Comparative Example 1 | Comparative Example 2 | Comparative Example 3 | Comparative Example 4 | Comparative Example 5 |
|---|---|---|---|---|---|---|---|---|---|---|
| (A) Amide-imide resin 1 | 100 | 80 | 100 | 100 | 100 | | | | | |
| (A') Amide-imide resin 2 | | | | | | 100 | 80 | | | |
| (A") Amide-imide resin 3 | | | | | | | | 100 | | |
| (B) Thermosetting resin 1 | 40 | 40 | | 40 | 40 | 40 | | 40 | 40 | |
| (B) Thermosetting resin 2 | | | 40 | | | | 40 | | | 40 |

TABLE 1-continued

| Component (only solid content) | Example 1 | Example 2 | Example 3 | Example 4 | Example 5 | Comparative Example 1 | Comparative Example 2 | Comparative Example 3 | Comparative Example 4 | Comparative Example 5 |
|---|---|---|---|---|---|---|---|---|---|---|
| (C) Thermosetting accelerator 1 | 1 | 1 | 1 |   | 1 | 1 | 1 | 1 | 1 | 1 |
| (C) Thermosetting accelerator 2 |   |   |   | 1 |   |   |   |   |   |   |
| (D) Inorganic particles 1 | 50 | 50 | 50 | 50 |   | 50 | 50 | 50 | 50 |   |
| (D) Inorganic particles 2 |   |   |   |   | 50 |   |   |   |   | 50 |
| Carboxyl group-containing resin |   | 20 |   |   |   |   | 20 |   |   | 100 |
| Phenol resin |   |   |   |   |   |   |   |   | 100 |   |
| Heat resistance (° C.) | 200 | 181 | 198 | 200 | 205 | 200 | 180 | 205 | 165 | 150 |
| Heat resistance (evaluation standard) | ◎ | ○ | ◎ | ◎ | ◎ | ◎ | ○ | ◎ | X | X |
| Residual stress (MPa) | 19.9 | 17.8 | 19.8 | 18.9 | 22.0 | 20.2 | 19.5 | 20.0 | 28.0 | 20.5 |
| Wafer warpage (μm) | 79 | 55 | 80 | 63 | 82 | 80 | 74 | 80 | 210 | 81 |
| Lamination properties | A | A | A | A | A | C | B | A | B | A |
| Light transmittance at 400 nm | A | B | A | A | A | A | B | C | D | C |

* Amounts blended in the table are based on parts by mass.

The details of materials shown in the table will be described below.

Amide-imide resin 1: Synthesized in Synthesis Example 1, Mn=800

Amide-imide resin 2: Synthesized in Synthesis Example 2, Mn=5800

Amide-imide resin 3: Synthesized in Synthesis Example 3, Mn=800

Thermosetting resin 1: Biphenyl-modified epoxy resin (NC-3000, manufactured by Nippon Kayaku Co., Ltd.)

Thermosetting resin 2: Dicyclopentadiene skeleton-containing epoxy resin (EPICLON® HP7200, manufactured by DIC Corporation)

Thermosetting accelerator 1: Imidazole-based curing agent (CUREZOL 2MZ-A, Shikoku Chemicals Corporation)

Thermosetting accelerator 2: 2-ethyl-4-methylimidazole (CUREZOL 2E4MZ, Shikoku Chemicals Corporation)

Inorganic particles 1: Barium sulfate, BF-10 manufactured by Sakai Chemical Industry Co., Ltd. (particle diameter: 100 nm)

Inorganic particles 2: Silica, SEAHOSTAR S10 manufactured by Nippon Shokubai Co., Ltd. (particle diameter: 100 nm)

Carboxyl group-containing resin: Synthesized in Synthesis Example 4 Phenol resin: Phenol novolac resin HF-1H (manufactured by Meiwa Plastic Industries, Ltd., hydroxyl value: 105 to 109 g/eq., solid content: 65%)

As described above, the curable resin compositions of the present invention will have not only excellent heat resistance, but also low residual stress, less susceptibility to wafer warpage, and good lamination properties. Furthermore, the curable resin compositions will have a good light transmittance.

The present invention is not limited to the structures in the above-described embodiment nor the examples It is possible to variously modify the present invention within the scope of the invention.

The invention claimed is:

1. A curable resin composition, comprising:
   an amide-imide resin;
   a thermosetting resin;
   a thermosetting accelerator;
   inorganic particles; and
   a carboxyl group-containing resin having no amide-imide structures, wherein the amide-imide resin is a reaction product of an isocyanurate-type polyisocyanate synthesized from an isocyanate having an aliphatic structure and a tricarboxylic anhydride having an aliphatic structure and has a number-average molecular weight of 500 to 900, and the thermosetting resin is a thermosetting resin selected from the group consisting of an epoxy compound having a biphenyl skeleton, an epoxy compound having a dicyclopentadienyl skeleton and a mixture thereof.

2. The curable resin composition according to claim 1, wherein the thermosetting resin includes an epoxy compound having a biphenyl skeleton.

3. The curable resin composition according to claim 2, wherein the curable resin composition forms a cured coated film when cured such that a light transmittance at 450 nm of the cured coated film when having a thickness of 20 μm is 95% or greater.

4. The curable resin composition according to claim 2, wherein the curable resin composition forms a cured coated film when cured such that a residual stress of the cured coated film is less than 25 MPa.

5. A dry film, comprising:
   a resin layer prepared from the curable resin composition of claim 2.

6. A cured product produced by a process comprising curing the resin layer of the dry film of claim 5.

7. An electronic component, comprising:
   the cured product of claim 6.

8. A cured product produced by a process comprising curing the curable resin composition of claim 2.

9. An electronic component, comprising:
   the cured product of claim 8.

10. The curable resin composition according to claim 1, wherein the curable resin composition forms a cured coated film when cured such that a light transmittance at 450 nm of the cured coated film when having a thickness of 20 μm is 95% or greater.

11. The curable resin composition according to claim 10, wherein the curable resin composition forms a cured coated film when cured such that a residual stress of the cured coated film is less than 25 MPa.

12. A dry film, comprising:
   a resin layer prepared from the curable resin composition of claim 10.

13. A cured product produced by a process comprising curing the curable resin composition of claim 10.

14. The curable resin composition according to claim 1, wherein the curable resin composition forms a cured coated film when cured such that a residual stress of the cured coated film is less than 25 MPa.

15. A dry film, comprising:
   a resin layer prepared from the curable resin composition of claim 14.

16. A dry film, comprising:
   a layer prepared from the curable resin composition of claim 1.

17. A cured product produced by a process comprising curing the resin layer of the dry film of claim 16.

18. An electronic component, comprising:
   the cured product of claim 17.

19. A cured product produced by a process comprising curing the curable resin composition of claim 1.

20. An electronic component, comprising:
   the cured product of claim 19.

* * * * *